US010635249B2

(12) United States Patent
Chang

(10) Patent No.: US 10,635,249 B2
(45) Date of Patent: Apr. 28, 2020

(54) SENSOR AND MANUFACTURING METHOD THEREOF

(71) Applicant: ILI TECHNOLOGY CORP., Hsinchu County (TW)

(72) Inventor: Hu-Chi Chang, Hsinchu County (TW)

(73) Assignee: ILI TECHNOLOGY CORP., Zhubei (TW)

( * ) Notice: Subject to any disclaimer, the term of this patent is extended or adjusted under 35 U.S.C. 154(b) by 18 days.

(21) Appl. No.: 16/030,002

(22) Filed: Jul. 9, 2018

(65) Prior Publication Data

US 2019/0018517 A1    Jan. 17, 2019

(30) Foreign Application Priority Data

Jul. 12, 2017    (TW) .............................. 106123272 A

(51) Int. Cl.
| | | |
|---|---|---|
| G06F 3/045 | (2006.01) | |
| G06F 3/044 | (2006.01) | |
| G06K 9/00 | (2006.01) | |
| G06F 3/041 | (2006.01) | |
| G01R 31/50 | (2020.01) | |

(52) U.S. Cl.
CPC ............. *G06F 3/044* (2013.01); *G01R 31/50* (2020.01); *G06F 3/0416* (2013.01); *G06K 9/0002* (2013.01); *G06F 2203/04103* (2013.01); *G06F 2203/04107* (2013.01); *G06F 2203/04111* (2013.01)

(58) Field of Classification Search
CPC ....... G06F 3/044; G06F 3/0416; G01R 31/00; G06K 9/0002

USPC .......................................................... 345/174
See application file for complete search history.

(56) References Cited

U.S. PATENT DOCUMENTS

| | | | | |
|---|---|---|---|---|
| 2011/0057905 | A1* | 3/2011 | Yu .......................... | G06F 3/0418 345/174 |
| 2014/0125880 | A1* | 5/2014 | Tsai .................... | G02F 1/13338 349/12 |
| 2015/0049044 | A1* | 2/2015 | Yousefpor ............... | G06F 3/044 345/174 |
| 2019/0004656 | A1* | 1/2019 | Hoka ...................... | G06F 3/047 |

FOREIGN PATENT DOCUMENTS

TW    M506319    8/2015

* cited by examiner

*Primary Examiner* — Jonathan M Blancha
(74) *Attorney, Agent, or Firm* — JCIPRNET

(57) ABSTRACT

A sensor and a manufacturing method thereof are provided. An inspection structure is first provided, wherein the inspection structure includes multiple electrode groups, multiple first connecting line segments and multiple second connecting line segments. Each electrode group includes two electrode sets, each of which includes a plurality of electrode strips. The electrode strips of one electrode set in each electrode group are connected in series by at least one second connecting line segment to electrically connect into a first electrode string, and the electrodes of the other electrode set in each electrode group are connected in series by at least one first connecting line segment to electrically connect into a second electrode string. A inspection step is then performed to determine whether an open circuit exists in the first and second electrode strings or whether a short circuit exist between the first and second electrode strings.

17 Claims, 12 Drawing Sheets

SENSOR AND MANUFACTURING METHOD THEREOF

This application claims the benefit of Taiwan application Serial No. 106123272, filed Jul. 12, 2017, the subject matter of which is incorporated herein by reference.

BACKGROUND OF THE INVENTION

Field of the Invention

The invention relates to a sensor and a manufacturing method thereof, and more particularly, to a sensor having undergone short-circuit and open-circuit inspection and a manufacturing method thereof.

Description of the Related Art

With the ever-evolving technologies, portable electronic devices, such as smart phones, tablet computers and laptop computers, have become indispensable tools in our daily lives. These portable electronic devices have diversified functions, and are usually stored with private personal data such as phonebooks, photos and personal information. Conventional electronic devices use passwords to protect user's privacy; however, passwords can be easily disclosed or cracked and have a lower degree of security. Further, a user must memorize a password in order to use an electronic device, which is definitely inconvenient. Therefore, personal fingerprints identification is developed to achieve the object of identity verification.

In a conventional capacitive fingerprint sensor, ridges and valleys on a fingerprint are detected by lattice structures formed by a plurality of driving electrodes and a plurality of sensing electrodes, so as to accordingly recognize a pattern of the fingerprint. However, in order to recognize ridges and valleys of a fingerprint, a distance between centers of two adjacent driving electrodes and a distance between centers of two adjacent sensing electrodes need to be at most less than a distance between ridges and peaks of two adjacent fingerprints. As such, an open circuit or a short circuit can be easily incurred when forming driving electrodes and sensing electrodes. In view of such issue, there is a need for a fingerprint sensor capable of inspecting an open circuit or a short circuit and an inspection method thereof.

In particular situations, the structure of a fingerprint sensor and a manufacturing method thereof are also applicable to a touch panel. One main difference between a fingerprint sensor and a touch panel lies in a distance between any two adjacent sensing electrode strips.

SUMMARY OF THE INVENTION

It is an object of the present invention to provide a sensor and a manufacturing method thereof. In the present invention, an inspection step is performed on a sensor before a step of providing a chip region, so as to prevent chip waste and reduce production costs.

To achieve the above object, the present invention provides a sensor including a substrate, at least one first electrode group, a plurality of floating line segments, an insulation layer, a plurality of second electrode groups and a plurality of second floating line segments. The first electrode group is provided on the substrate, and includes a first electrode set and a second electrode set, wherein each of the first electrode set and the second electrode set includes a plurality of first electrode strips. The first floating line segments and the first electrode group are formed by a same first conductive layer, and the two are insulated and separated. The insulation layer is provided on the first conductive layer. The second electrode groups are provided on the insulation layer, and are sequentially arranged in a second direction and intersect the first electrode group. Each of the second electrode groups includes a third electrode set and a fourth electrode set, and each of the third electrode set and the fourth electrode set includes a plurality of second electrode strips. The second floating line segments and the second electrode groups are formed by a same second conductive layer, and the two are insulated and separated. Two end points of each second floating line segment respectively correspond to end points of two adjacent second electrode strips in each third electrode set, and two end points of each first floating line segment respectively correspond to end points of two adjacent second electrode strips in each fourth electrode set.

To achieve the above object, the present invention further provides a manufacturing method of a sensor. The manufacturing method includes the following steps. An inspection structure is first provided, wherein the inspection structure includes at least one first electrode group, a plurality of first connecting line segments, an insulation layer, a plurality of second electrode groups and a plurality of second connecting line segments. The first electrode group includes a first electrode set and a second electrode set. Each of the first electrode set and the second electrode set includes a plurality of first electrode strips. The first connecting line segments and the at least one first electrode group are formed by a same first conductive layer, and the two are insulated and separated. The insulation layer is provided on the first conductive layer. The second electrode groups are provided on the insulation layer, and are sequentially arranged in a second direction and intersect the first electrode group. Each of the second electrode groups includes a third electrode set and a fourth electrode set, and each of the third electrode set and the fourth electrode set includes a plurality of second electrode strips. The second floating line segments and the second electrode groups are formed by a same second conductive layer, and the two are insulated and separated. The second electrode strips in the third electrode set in each second electrode group are connected in series by the second connecting line segments to electrically connected into a first electrode string, and the second electrode strips in the fourth electrode set in each second electrode group are connected in series by the first connecting line segments to electrically connect into a second electrode string. A inspection step is then performed, in which a first voltage signal is provided at one end of each first electrode string and one end of each second electrode string, and a corresponding second voltage signal at the other end of each first electrode string and the other end of each second electrode string is correspondingly measured, so as to determine whether an open circuit occurs in the first electrode strings and the second electrode strings or a short circuit occurs between the first electrode string and the corresponding second electrode strings.

To achieve the above object, the present invention further provides a sensor including a substrate, a plurality of first electrode strips, a plurality of first line segments, a plurality of second electrode strips and a guard ring. The first electrode strips are provided on the substrate and are arranged along a first direction. The first line segments are electrically connected to the corresponding first electrode strips, respectively. The second electrode strips are arranged along a second direction, and are insulated from and intersect the first electrode strips. The guard ring is provided at outer sides of the first electrode strips and the second electrode strips, and is insulated from the first electrode strips and the second electrode strips. The first line segments overlap the guard ring in a top view direction of the substrate.

With the manufacturing method of a sensor of the present invention, whether an open circuit or a short circuit occurs in a chip can be inspected before attaching the chip on a pad of a chip region, thereby preventing chip waste caused by defective sensors and thus saving production costs.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
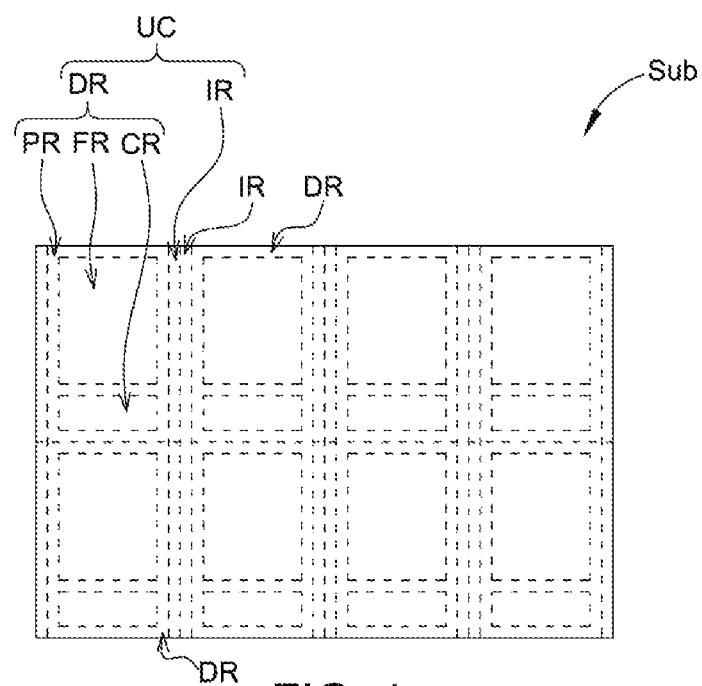
FIG. 1 shows various regions defined in a substrate according to an embodiment of the present invention.

FIG. 1 to FIG. 10 are schematic diagrams of a fingerprint sensor according to a first embodiment of the present invention. FIG. 1 shows various regions defined in a substrate according to the first embodiment of the present invention. As shown in FIG. 1, a substrate Sub is provided. The substrate Sub is defined with a plurality of unit regions UC, which may include a device region DR and at least one inspection region IR. A fingerprint sensor may be provided in each device region DR, and a signal transmitting and receiving end for detecting a fingerprint sensor may be provided in the corresponding inspection region IR. The device region DR may further include a fingerprint sensing region FR, a chip region CR and a peripheral region PR. The fingerprint sensing region FR may be used for placing sensing elements for fingerprint recognition, the chip region CR may be used for placing control chips for driving the sensing elements, and the peripheral region PR is for placing peripheral lines and wires. The substrate Sub may be a transparent substrate, for example but not limited to, a glass substrate, a reinforced glass substrate, a sapphire substrate, a plastic substrate or a printed circuit board (PCB).

Figure 2:
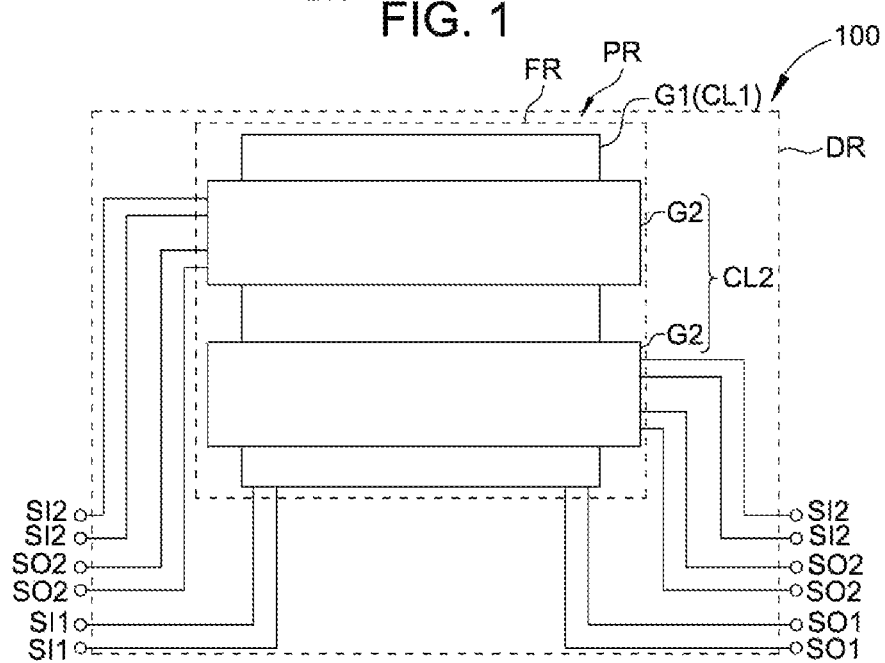
FIG. 2 is a top schematic diagram of an inspection structure according to an embodiment of the present invention.

FIG. 2 shows a top schematic diagram of an inspection structure according to the first embodiment of the present invention. To clearly show the structures in the device regions DR, only an inspection structure 100 in one single device region DR is depicted in FIG. 2 and in the following drawings; however, the present invention is not limited thereby. As shown in FIG. 2, the inspection structure 100 is formed on the substrate Sub, and includes at least one first electrode group G1 and a plurality of second electrode groups G2. The first electrode group G1 and the second electrode groups G2 may be placed in the fingerprint sensing region FR. The first electrode group G1 may be electrically connected to a plurality of first signal input ends SI1 and a plurality of first signal output ends SO1 so as to perform inspection. For example, the numbers of the first signal input ends SI1 and the first signal output ends SO1 electrically connected to the first electrode group G1 may be, for example but not limited to, two, respectively. In another embodiment, the inspection structure 100 may also include a plurality of first electrode groups G1 and different first electrode groups G1 are separated to perform inspection. The second electrode groups G2 are arranged along a second direction D2, and intersect and are separated from the first electrode group G1. The second electrode groups G2 may be electrically connected to a plurality of second signal input ends SI2 and a plurality of signal output ends SO2, respectively, so as to separate different second electrode groups G2 to perform inspection. The quantities of the second signal input ends SI2 and the second signal output ends SO2 electrically connected to the second electrode groups G2 may be, for example but not limited to, two, respectively, or may be equaled to or more than three.

Figure 3:
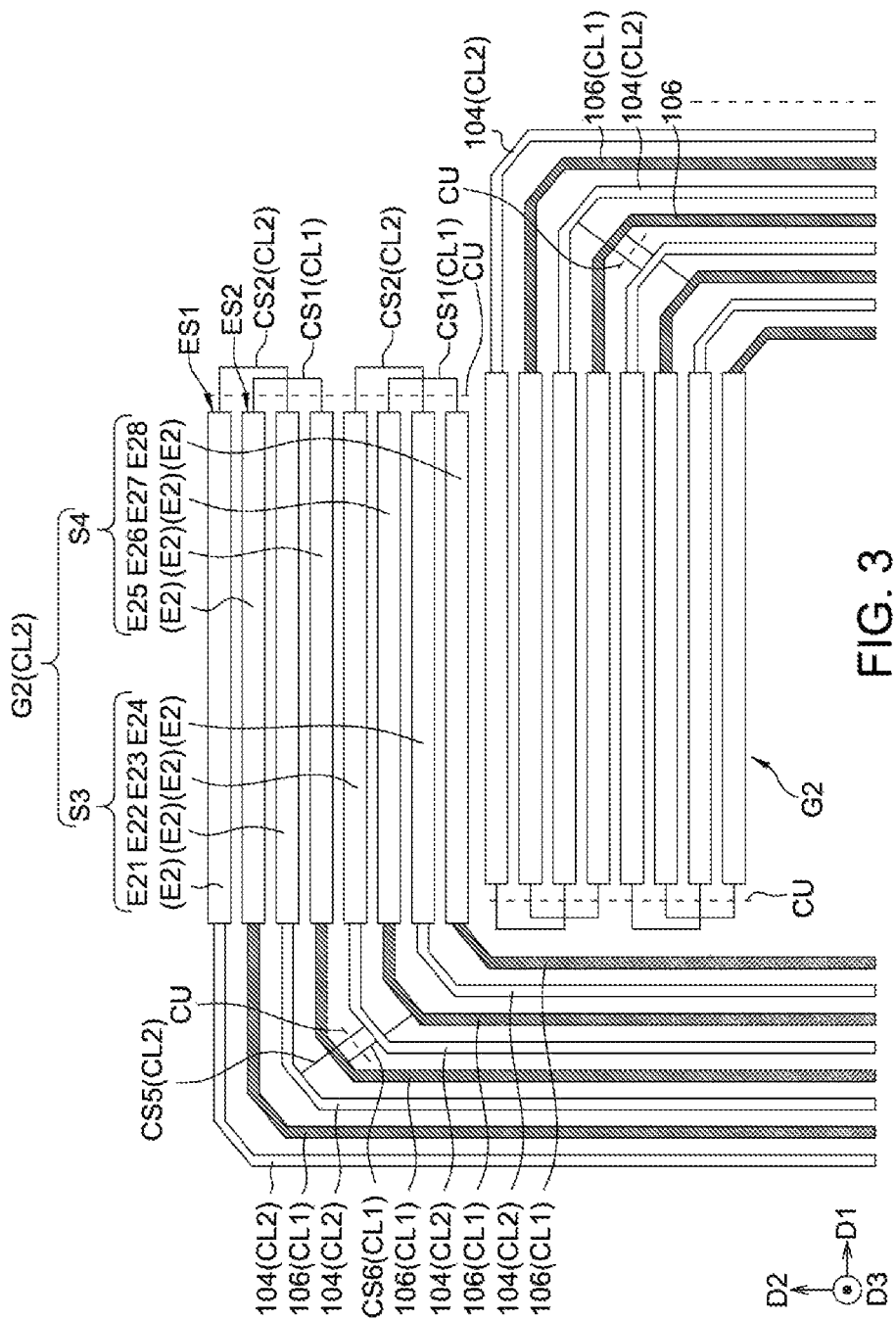
FIG. 3 is a top schematic diagram of a second electrode group and corresponding conductive lines and connecting line segments according to the first embodiment of the present invention.

The inspection structure 100 is described in detail below. FIG. 3 shows a top schematic diagram of a second electrode group and corresponding conductive lines and connecting line segments according to the first embodiment of the present invention. As shown in FIG. 3, each second electrode group G2 may be formed by a second conductive layer CL2, and includes a first electrode set S3 and a fourth electrode set S4. During the inspection process, the first electrode set S3 and the fourth electrode set S4 may be used to transmit different signals to determine if a short circuit and an open circuit exists. The first electrode set S3 and the fourth electrode set S4 may include a plurality of mutually separated second electrode strips E2, respectively. In this embodiment, the second electrode strips E2 of the third electrode set S3 and the second electrode strips E2 of the fourth electrode set S4 in each second electrode group G2 are, for example but not limited to, sequentially and alternatingly arranged along a second direction D2.

The inspection structure 100 may further include a plurality of first connecting line segments CS1 and a plurality of second connecting line segments CS2. Each first connecting line segment CS1 electrically connects two adjacent second electrode strips E2 in each fourth electrode set S4, and each second connecting line segment CS2 electrically connects two adjacent second electrode strips E2 in each third electrode set S3. In this embodiment, the first connecting line segments CS1 and the second connecting line segments CS2 corresponding to the same second electrode group G2 are located on the same side of the corresponding second electrode group G2. Further, because the second electrode strips E2 of the third electrode set S3 and the second electrode strips E2 of the fourth electrode set S4 are sequentially and alternatingly arranged along the second direction D2, each second connecting line segment CS2 crosses one corresponding first connecting line segment CS1. To prevent the first connecting line segment CS1 and the second connecting line segment CS2 from being mutually electrically connected to each other, for example but not limited to, the first connecting line segments CS1 are formed by a first conductive layer CL1 and the second connecting line segments CS2. In another embodiment, the first connecting line segments CS1 and the second connecting line segments CS3 may also be formed by the second conductive layer CL2 and the first conductive layer CL1, respectively. Further, the second electrode strips E2 in the third electrode set S3 in each second electrode group G2 may be electrically connected in series with at least one first connecting line segment CS1 to form a first electrode string ES1, and the second electrode strips E2 in the fourth electrode set S4 in each second electrode group G2 may be electrically connected in series with at least one second connecting line segment CS2 to form a second electrode string ES2. For example, when the numbers of the second electrode strips E2 in each first electrode string ES1 and the second electrode strips E2 in the second electrode string ES2 are two, respectively, each first electrode string ES1 may be formed by electrically connecting two second electrode strips E2 by only one second connecting line segment CS2, and each second electrode string ES2 may be similarly formed by electrically connecting two second electrode strips E2 by only one first connecting line segment CS1. When the numbers of the second electrode strips E2 in each first electrode string ES1 and the second electrode strips E2 in each second electrode string ES2 are greater than two, e.g., four, respectively, the inspection structure 100 corresponding to each second electrode group G2 may further include at least one fifth connecting line segment CS5 and at least one sixth connecting line segment CS6. Taking the second electrode strips E21, E22, E23 and E24 of the third electrode set S3 for example, in addition to the second connecting line segment CS2 respectively connecting two adjacent second electrode strips E21 and E22 and two adjacent second electrode strips E23 and E23, the fifth connecting line segment CS5 that electrically connects between the second electrode strips E22 and E23 may be further included on the other side of the second electrode strips E21, E22, E23 and E24; that is to say, the fifth connecting line segment CS5 electrically connects between two second electrode strips E22 and E23 connected by different second connecting segments CS2, such that the second electrode strips E21, E22, E23 and E24 may be connected in series by the second connecting line segments CS2 and the fifth connecting line segment CS5 to form the first electrode string ES1. Similarly, taking the second electrode strips E25, E26, E27 and E28 of the fourth electrode set S4 for example, the sixth connecting line segment CS6 electrically connecting the second electrode strips E26 and S27 may be further included; that is, the sixth connecting segment CS6 electrically connects two second electrode strips E26 and E27 connected by different first connecting line segments CS1, and the sixth connecting line segment CS6 and the first connecting line segments CS1 are respectively on two opposite sides of the second electrode strips E25, E26, E27 and E28.

The inspection structure 100 may further include a plurality of first conductive lines 104 and a plurality of second conductive lines 106. Each first conductive line 104 is connected to one corresponding second electrode strip E2 in each third electrode set S3, and is for electrically connecting each second electrode strip E2 in each third electrode set S3 to the corresponding pad P1 (not shown). Further, each second conductive line 106 is electrically connected to one second electrode strip E2 in each fourth electrode set S4, and is for electrically connecting each second electrode strip E2 of each fourth electrode set S4 to the corresponding pad P2 (not shown). In this embodiment, the first conductive lines 104 and the second conductive lines 106 corresponding to the same second electrode group G2 extend out from the same side of the corresponding second electrode group G2. Further, to prevent the first conductive lines 104 and the second conductive lines 106 corresponding to the same second electrode group G2 from mutually affecting the first connecting line segments CS1 and the second line segments CS2 in regard to configuration, the first conductive lines 104 and the second conductive lines 106 are located on one side of the corresponding second electrode group G2, and the first connecting line segments CS1 and the second line segments CS2 corresponding to the same second electrode group G2 are located on the opposite side of the second electrode group G2. It should be noted that, the first conductive lines 104 and the second conductive lines 106 in this embodiment may be formed by the second conductive layer CL2 and the first conductive layer CL1, respectively. Thus, the distance between the adjacent first conductive line 104 and second conductive line 106 is not limited by a patterning process, such that the distance between the adjacent first conductive line 104 and second conductive line 106 may be reduced so as to shrink the width of the peripheral regions PR on the left and right sides of the fingerprint sensing region FR. Further, the first conductive lines 104 and the second conductive lines 106 respectively electrically connected to adjacent second electrode groups G2 may be provided on two sides of the second electrode strips E2, respectively, so as to evenly distribute the first conductive lines 104 and the second conductive lines 106 within the peripheral regions PR on the left and right sides of the fingerprint sensing region FR. Accordingly, the first connecting line segments CS1 and the second connecting line segments CS2 corresponding to adjacent second electrode groups G2 are provided on two sides of the second electrode groups G2. Further, the fifth connecting line segment CS5 may connect between two corresponding first conductive lines 104, i.e., connecting between two first conductive lines 104 respectively connected to the first electrode strips E22 and E23, and cross the second conductive line 106 between these two first conductive lines 104. The sixth connecting line segment CS6 may connect two corresponding second conductive lines 106, i.e., connecting two corresponding conductive lines 106 that are respectively connected to the second electrode strips E26 and E27, and cross the first conductive line 104 between these two second conductive lines 106. In this embodiment, the fifth connecting line segments CS5 and the first conductive lines 104 may be formed by the same second conductive layer CL2, allowing the fifth connecting line segments CS5 to direct cross the corresponding second conductive lines 106 without involving additional bridging line segments. The sixth connecting line segments CS6 may be formed by the same first conductive layer CL2 as the second conductive lines 106, allowing the sixth connecting line segments CS6 to directly cross the corresponding first conductive lines 104 without involving additional bridging line segments.

Figure 4:
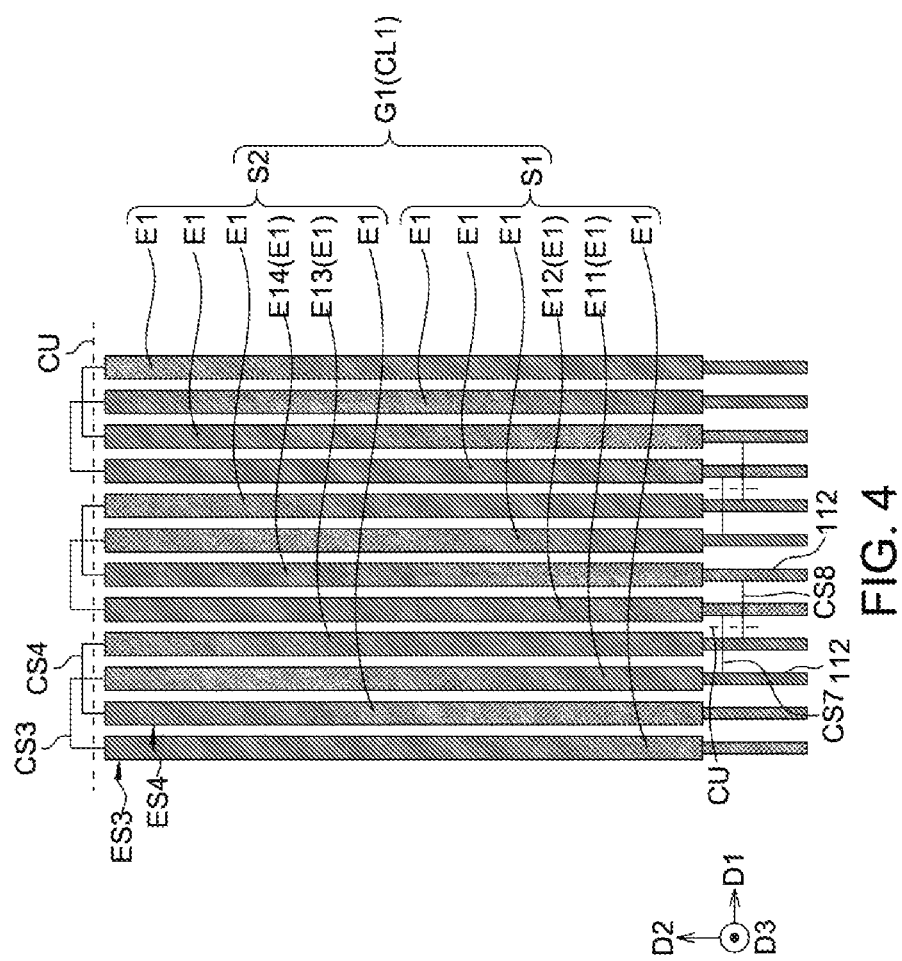
FIG. 4 is a top schematic diagram of a first electrode group and corresponding conductive lines and connecting line segments according to the first embodiment of the present invention.

FIG. 4 shows a top schematic diagram of a first electrode group and corresponding conductive lines and connecting line segments according to the first embodiment of the present invention. As shown in FIG. 4, the first electrode group G1 may be formed by the first conductive layer CL1, and may include one first electrode set S1 and one second electrode set S2, which may transmit different signals during an inspection process so as to determine if a short circuit or an open circuit exists. Each of the first electrode set S1 and the second electrode set S2 may include a plurality of first electrode strips E1 that are mutually separated. In this embodiment, the first electrode strips E1 of the first electrode set S1 and the first electrode strips E1 of the second electrode set S2 are, for example but not limited to, sequentially and alternatingly arranged along a first direction D1. Referring to FIGS. 2, 3 and 4, as shown in FIG. 2, the first electrode group G1 intersects the second electrode groups G2. As shown in FIGS. 3 and 4, the second electrode group G2 includes a plurality of mutually separated second electrode strips E2, and the first electrode group G1 includes a plurality of mutually separated first electrode strips E1. Thus, the first electrode strips E1 intersect the second electrode strips E2, such that the first electrode strips E1 generate capacitance coupling with the second electrode strips E2. Further, the distance between centers of any two adjacent first electrode strips E1 and the distance between the centers of any two adjacent second electrode strips E2 may be 50 μm, allowing the coupling capacitance generated by the first electrode strips E1 and the second electrode strips E2 to detect capacitance differences between ridges and valleys of fingerprints and hence achieving fingerprint sensing.

The inspection structure 100 may further include a plurality of third connecting line segments CS3, each of which connects two adjacent first electrode strips E1 in the first electrode set S1, such that the first electrode strips E1 of the first electrode set S1 in the first electrode group G1 may be electrically connected in series by the third connecting line segments CS3 to form a third electrode string ES3. More specifically, the inspection structure 100 may further include a plurality of seventh connecting line segments CS7, each of which connects two adjacent third connecting line segments CS3, i.e., electrically connecting two first electrode strips E1 that are connected to different third connecting line segments CS3. As such, the first electrode strips E1 of the first electrode set S1 may be connected in series by the third connecting line segments CS3 and the seventh connecting line segments CS7 to form the third electrode string ES3.

The inspection structure 100 may further include a plurality of fourth connecting line segments CS4, each of which connects two adjacent first electrode strips E1 in the second electrode set S2, such that the first electrode strips E1 of the second electrode set S2 in the first electrode group G1 may be electrically connected in series by the fourth connecting line segments CS4 to form a fourth electrode string ES4. The fourth connecting line segments CS4 and the third connecting line segments CS3 are provided on the same side of the first electrode group G1. Because the first electrode strips E1 of the first electrode set S1 and the first electrode strips E1 of the second electrode set S2 are sequentially and alternatingly arranged along the first direction D1, each third connecting line segments CS3 crosses one corresponding fourth connecting line segment CS4. By forming the third connecting line segments CS3 and the fourth connecting line segments CS4 by the first conductive layer CL1 and the second conductive layer CL2, respectively, the third connecting line segments CS3 can be insulated from the fourth connecting line segments CS4, thus preventing the third connecting line segments CS3 from short-circuiting with the fourth connecting line segments CS4. In another embodiment, the third connecting line segments CS3 and the fourth connecting line segments CS4 may also be formed by the second conductive layer CL2 and the first conductive layer CL1, respectively.

The inspection structure 100 may further include a plurality of eighth connecting line segments CS8, each of which connects two adjacent fourth connecting line segments CS4, i.e., electrically connecting two first electrode strips E1 connected to different fourth connecting line segments CS4, such that each first electrode E1 is located between the fourth connecting line segment CS4 and the eighth connecting line segment CS8. Accordingly, the first electrode strips E1 of the second electrode set S2 may be connected in series by the fourth connecting line segments CS4 and the eighth connecting line segments CS8 to form the third electrode string ES3.

In this embodiment, the inspection structure 100 may further include a plurality of third conductive lines 112, each of which is electrically connected to one corresponding first electrode E1 and electrically connects along the second direction D2 the corresponding first electrode strip E1 to the corresponding pad P. The third conductive lines 112 extend out from the same side of the first electrode group G1. To prevent the third conductive lines 112 from mutually affecting the third connecting line segments CS3 and the fourth line segments CS4 in regard to configuration, the third conductive lines 112 are located on one side the first electrode group G1, and the third connecting segments CS3 and the fourth connecting line segments CS4 are located on the opposite side of the first electrode group G1. In this embodiment, the third conductive lines 112 and the first electrode strips E1 are formed by the same first conductive layer CL1. Further, each seventh connecting line segment CS7 may connect two corresponding third conductive lines 112, i.e., electrically connecting two third conductive lines 112 that are respectively connected to two adjacent first electrode strips E11 and E12 in the first electrode set S1, and cross the third conductive line 112 between these two third conductive lines 112. Each eighth connecting line segment CS8 may connect two corresponding third conductive lines 112, i.e., connecting two third conductive lines 112 that are respectively connected to the second electrode strips E13 and E14, and cross the third conductive line 112 between these two third conductive lines 112. Because the seventh connecting line segments CS7, the eighth connecting line segments CS8 and the third conductive lines 112 are located on the same side of the first electrode group G1, to prevent the seventh connecting line segments CS7 and the eighth connecting line segments CS8 from electrically connecting two adjacent third conductive lines 112, the seventh connecting line segments CS7 and the eighth connecting line segments CS8 may be formed by the same second conductive layer CL2, such that seventh connecting line segments CS7 and the eighth connecting line segments CS8 may cross the corresponding third conductive lines 112 without involving additional bridging line segments. In this embodiment, the seventh connecting line segments CS7 and the eighth connecting line segments CS8 may be electrically connected to the corresponding third conductive lines 112 through vias.

Figure 5:
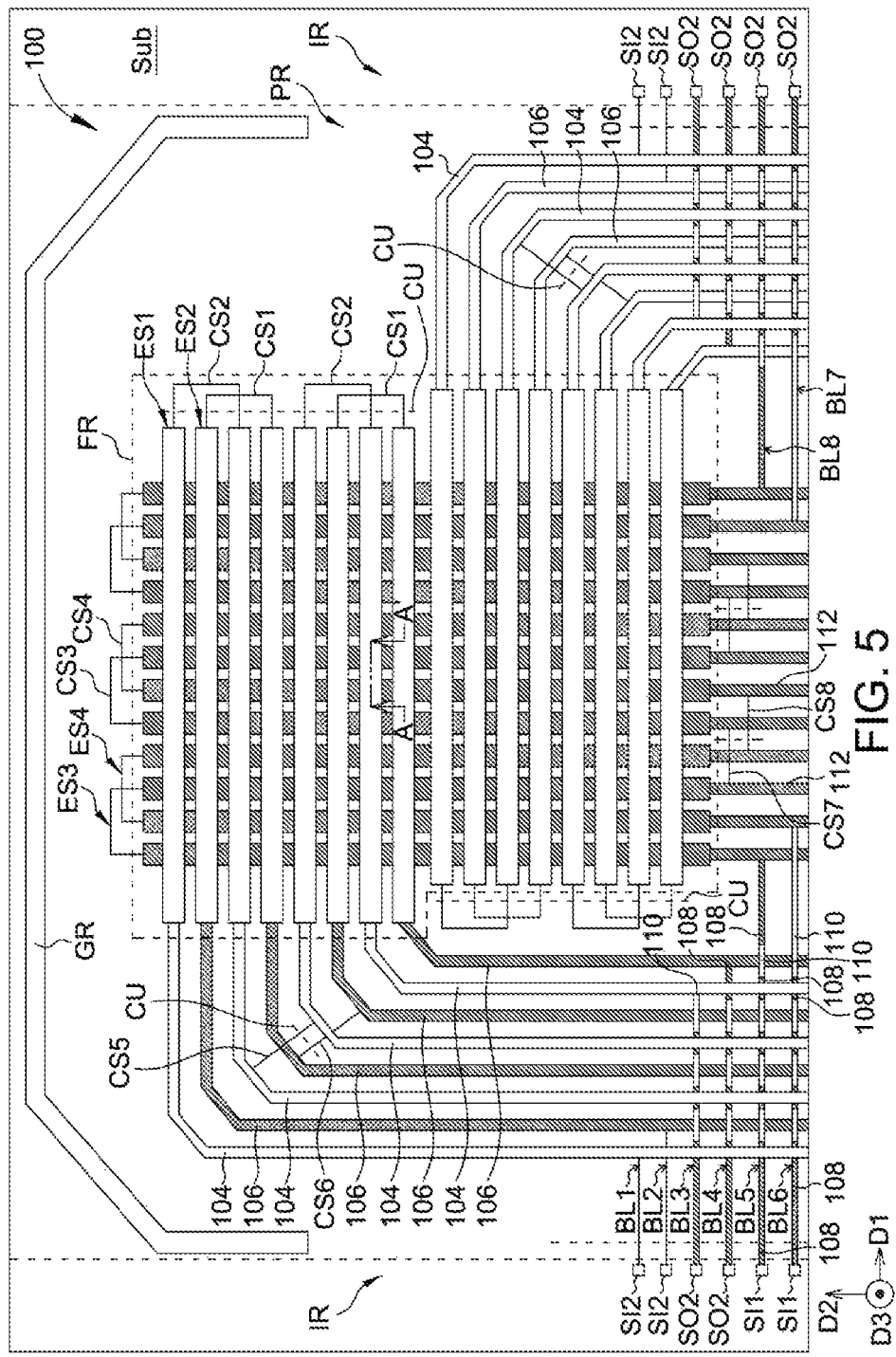
FIG. 5 is a top schematic diagram of an inspection structure in a fingerprint sensor region and a part of peripheral regions according to the first embodiment of the present invention.
Figure 6:
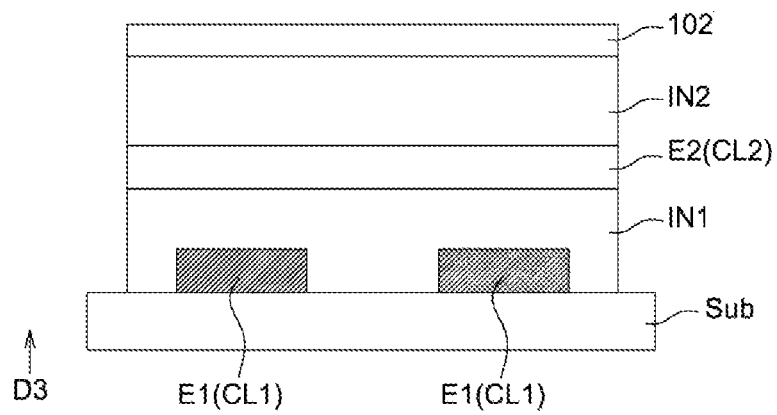
FIG. 6 is a sectional schematic diagram along a section line A-A' in FIG. 5.

Referring to FIGS. 5 and 6, FIG. 5 shows a top schematic diagram of an inspection structure in a fingerprint sensing region and a part of peripheral regions according to the first embodiment of the present invention; FIG. 6 shows a sectional schematic diagram along a section line A-A' in FIG. 5. As shown in FIGS. 5 and 6, an insulation layer IN1 is provided between the first conductive layer CL1 and the second conductive layer CS2, and thus the first electrode strips E1 formed by the first conductive layer CL1 and the second electrode strips E2 formed by the second conductive layer CL2 may be mutually insulated by means of the first insulation layer 11. Similarly, the first connecting line segments CS1 formed by the first conductive layer CL1 may be electrically insulated from the second connecting line segments CS2 formed by the second conductive layer CL2 by means of the first insulation layer CL1; the third connecting line segments CS3 formed by the first conductive layer CL1 may be electrically insulated from the fourth connecting line segments CS4 formed by the second conductive layer CL2. Further, the fifth connecting line segments CS5 and the sixth connecting line segments CS6 may be electrically insulated from the crossing second conductive lines 106 and first conductive lines 104 by means of the first insulation layer IN1, respectively; the seventh connecting line segments CS7 and the eighth connecting line segments CS8 may be electrically insulated from the crossing third conductive lines 112 by means of the first insulation layer IN1. Further, the second electrode strips E2 formed by the second conductive layer CL2 may contact the second conductive lines 106 formed by the first conductive layer CL1 through the vias of the first insulation layer IN1 to further become mutually electrically connected. Similarly, the connecting line segments formed by the first conductive layer CL1 or the second conductive layer CL2 may become electrically connected to the corresponding electrode strips or conductive lines through other vias of the first insulation layer IN1, and such similar details are omitted herein.

In this embodiment, the inspection structure 100 may further include a second insulation layer IN2 and a cover layer 102 sequentially provided on the second conductive layer CL2. For example, the first conductive layer CL1 and the second conductive layer CL2 may include metal, graphene or other conductive materials, and the present invention is not limited to the examples above. The first insulation layer IN1, the second insulation layer IN2 and the cover layer 102 may include silicon oxide, silicon nitride or other insulation materials, and the present invention is not limited to the above examples.

To respectively electrically connect the first electrode string ES1 and the second electrode string ES2 to the second signal input end SI2 and the second signal output end SO2, the inspection structure 100 may further include a plurality of bridging lines BL1, a plurality of second bridging lines BL2, a plurality of third bridging lines BL3 and a plurality of fourth bridging lines BL4. Each first bridging line BL1 may electrically connect one end of the first electrode string ES1 in each second electrode group G2 to one corresponding second signal input end SI2. Each second bridging line BL2 may electrically connect one end of the second electrode string ES2 in each second electrode group G2 to one corresponding second signal input end SI2. Each third bridging line BL3 may electrically connect the other end of the first electrode string ES1 in each second electrode group G2 to one corresponding second signal output end SO2. Each fourth bridging line BL4 may electrically connect the other end of the second electrode string ES2 in each second electrode group G2 to one corresponding second output end SO2. It should be noted that, except the first bridging line BL1 and the second bridging line BL2 respectively connected to the first conductive line 104 and the second conductive line 106 of the nearest inspection region IR, i.e., the first bridging line BL1 and the second bridging line BL2 connected to the first electrode string ES1 and the second electrode string ES2 of two second electrode groups G2 farthest away from the chip region CR, each of the remaining first bridging lines BL1, the second bridging lines BL2, the third bridging lines BL3 and the fourth bridging lines BL4 at least crosses one first conductive line 104 or one second conductive line 106, and thus includes at least one cross connection portion, and the cross connection portion and the crossed first conductive line 104 or second conductive line 106 may be formed by different conductive layers. For example, the third bridging line BL3 connected to the second electrode group G2 may include three first cross connection portions 108 and three second cross connection portions 110. The first cross connection portions 108 are formed by the first conductive layer CL1, and the second bridge portions 110 are formed by the second conductive portions CL2. The first bridge portions 108 and the second bridge portions 110 are sequentially and alternatingly connected, each first cross connection portion 108 crosses one corresponding conductive line 104, and each second cross connection portion 110 crosses one corresponding second conductive line 106. The first cross connection portion 108 of the third bridging line BL3 nearest to the inspection region FR may extend into the inspection region IR to connect to the second signal output end SO2, and the second cross connection portion 110 nearest to the fingerprint sensing region FR may be connected to the second conductive line 106. Further, the fourth bridging line BL4 connected to the second electrode group G2 may include four first cross connection portions 108 and three second cross connection portions 110, and each second cross connection portion 110 is provided between any two adjacent first cross connection portions 108. However, the present invention is not limited to the above example. Further, the numbers the first cross connection portions 108 and the second cross connection portions 110 of the first bridging lines BL1, the second bridging lines BL2, the third bridging lines BL3 and the fourth bridging lines BL4 may be determined by the numbers of the crossed first conductive lines 104 and second conductive lines 106, and the numbers of the crossed first conductive lines 104 and second conductive lines 106 may be determined by the positions of the second electrode groups G2 and the numbers of the second electrode strips E2 in the first electrode strings ES1 and the second electrode strings ES2. The bridging lines of other second electrode groups G2 may apply the same design as above, and similar details are omitted herein.

Further, the inspection structure 100 may include at least one fifth bridging line BL5, at least one sixth bridging line BL6, at least one seventh bridging line BL7 and at least one eighth bridging line BL8. The first bridging line BL5 may electrically connect one end of the third electrode string ES3 to one first signal input end S11, the sixth bridging line BL6 may electrically connect one end of the fourth electrode string ES4 to another first signal input end S11, the seventh bridging line BL7 may electrically connect the other end of the third electrode string ES3 to one second signal output end SO2, and the eighth bridging line BL8 may electrically connect the other end of the fourth electrode string ES4 to another second signal output end SO2. The fifth bridging line BL5, the sixth bridging line BL6, the seventh bridging line BL7 and the eighth bridging line BL8 need to cross the first conductive lines 104 and the second conductive lines 106, and thus each includes a plurality of cross connection portions. For example, the fifth bridging line BL5 includes five first cross connection portions 108 and four second cross portions 110, each second cross connection portion 110 is disposed between any two adjacent first cross connection portions 108, each second cross connection portion 110 crosses the corresponding second conductive line 106, and the first cross connection portion 108 located between any two adjacent second cross portions 110 crosses one corresponding first conductive line 104. The sixth bridging line BL6 includes four first cross connection portions 108 and four second cross connection portions 110, the first cross connection portions 108 and the second cross connection portions 110 are sequentially and alternatingly connected, each first cross connection portions 108 crosses the corresponding first conductive line 104, and the second cross connection portion 110 between any two adjacent first cross connection portions 108 crosses one corresponding second conductive line 106. The numbers of the first cross connection portions 108 and the second cross connection portions 110 of the fifth bridging line BL5, the sixth bridging lines BL6, the seventh bridging lines BL7 and the eighth bridging lines BL8 may be determined by the numbers of the crossed first conductive lines 104 and second conductive lines 106, and the numbers of the crossed first conductive lines 104 and second conductive lines 106 may be determined by the positions of the second electrode groups G2 and the numbers of the second electrode strips E2 in the first electrode string ES1 and the second electrode string ES2.

The inspection structure 100 may further include a guard ring GR provided on the outer sides of the first electrode strips E1 and the second electrode strips E2, and the first connecting line segments CS1, the second connecting line segments CS2, the fifth connecting line segments CS5, the sixth connecting line segments CS6, the first conductive lines 104 and the second conductive lines 106 are provided between the guard ring GR and the first electrode strips E1 and the second electrode strips E2.

Figure 7:
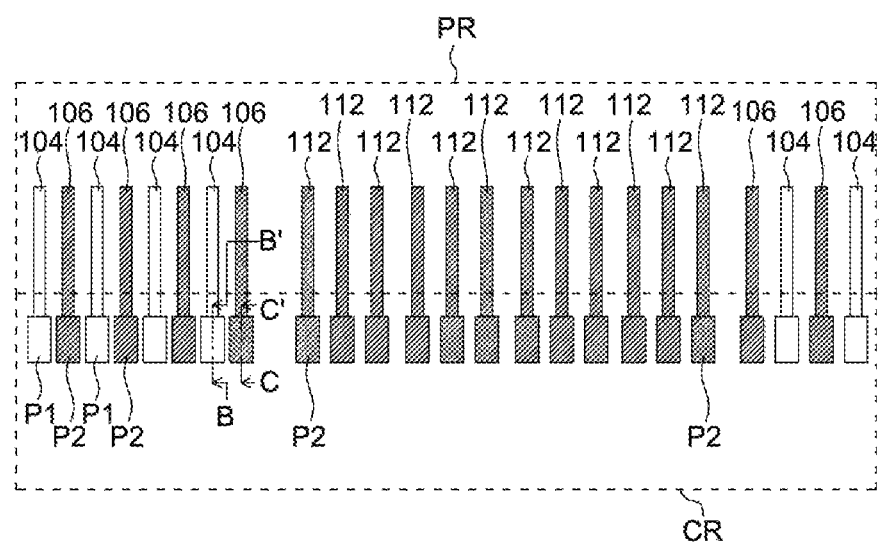
FIG. 7 is a top schematic diagram of an inspection structure in a chip region and a part of peripheral regions according to the first embodiment of the present invention.
Figure 8:
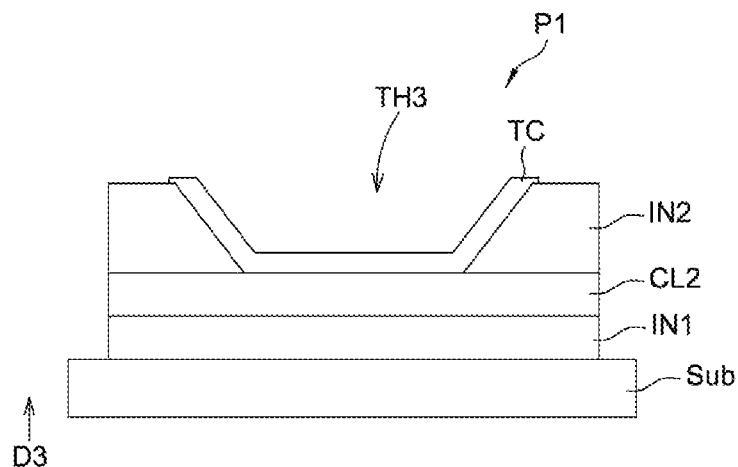
FIG. 8 and FIG. 9 are sectional schematic diagrams along section lines B-B' and C-C' in FIG. 7, respectively.
Figure 9:
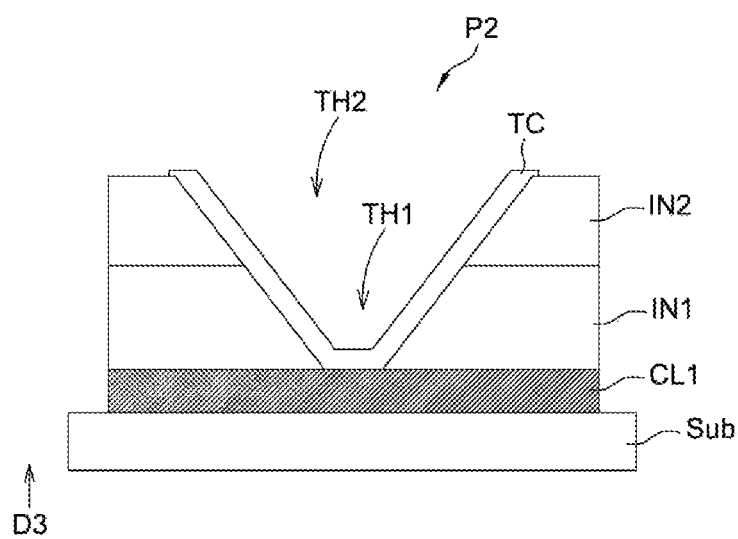

Referring to FIGS. 7 to 9, FIG. 7 shows a top schematic diagram of an inspection structure in a chip region and a part of the peripheral regions according to the first embodiment of the present invention; and FIGS. 8 and 9 show sectional schematic diagrams along sections lines B-B' and C-C' in FIG. 7, respectively. As shown in FIGS. 7 to 9, each first conductive line 104 may electrically connect to one corresponding pad P1, and each second conductive line 106 and each third conductive line 112 may respectively electrically connect to one corresponding pad P2. In this embodiment, the first conductive lines 104, the second conductive lines 106 and the third conductive lines 112 may respectively extend into the chip region CR. The first insulation layer IN1 may include a plurality of vias TH1, which respectively expose the second conductive lines 106 and the third conductive lines 112 formed by the first conductive layer CL1. The second insulation layer IN2 may include a plurality of vias TH2 and a plurality of third vias TH3. The second vias TH2 are provided correspondingly to the first vias TH1, respectively, so as to expose the corresponding second conductive lines 106 and the third conductive lines 112. The third vias TH3 respectively expose the first conductive lines 104 formed by the second conductive layer CL2. Further, the pads P1 and P2 may include a plurality of transparent conductive pads TC that are respectively provided on the exposed first conductive lines 104, second conductive lines 108 and third conductive lines 112, so as to prevent the first conductive lines 104, the second conductive lines 108 and the third conductive lines 112 from oxidation. The transparent conductive pads TC may be formed by the same transparent conductive layer, which may include, for example, a transparent conductive material such as indium tin oxide or indium zinc oxide.

An inspection step is performed after the inspection structure 100 is formed. In the inspection step, a first voltage signal is provided at one end of each first electrode string ES1 and one end of each second electrode string ES2, that is, a corresponding first voltage signal is inputted at each second signal input end SI2, e.g., a 5V voltage or a signal having a predetermined inspection code. Further, in the inspection step, a corresponding second voltage signal is measured at the other end of each first electrode string ES1 and the other end of each second electrode string ES2, that is, a second voltage signal is received from each second signal output end SO2. By measuring the first voltage signal and the second voltage signal corresponding to the same first electrode string ES1 and the same second electrode string ES2, whether an open circuit occurs in the first electrode strings ES1 and the second electrode strings ES2 and whether a short circuit occurs between the first electrode strings ES1 and the second electrode strings ES2 can be determined.

In the inspection step, a third voltage signal is further provided to one end of each third electrode string ES3 and one end of each fourth electrode string ES4, that is, a corresponding third voltage signal is provided at each first signal input end S11, e.g., a 5V voltage or a signal having a predetermined inspection code; and a fourth voltage signal is measured at the other end of each third electrode string ES3 and the other end of each fourth electrode string ES4, that is, a corresponding fourth voltage signal is received from the other end of each first signal output end SO1. By measuring the third voltage signal and the fourth voltage signal corresponding to the same third electrode string ES3 and the same fourth electrode string ES4, whether an open circuit occurs in the third electrode strings ES3 and the fourth electrode strings ES4 and whether a short circuit occurs between the third electrode strings ES3 and the fourth electrode strings ES4 can be determined. It should be noted that, when the inspection step is performed, the pads P1 and P2 in the chip region CR are not yet provided with chips, so as to prevent chip waste caused as a result that the inspection structure 100 is inspected as a defective.

Figure 10:
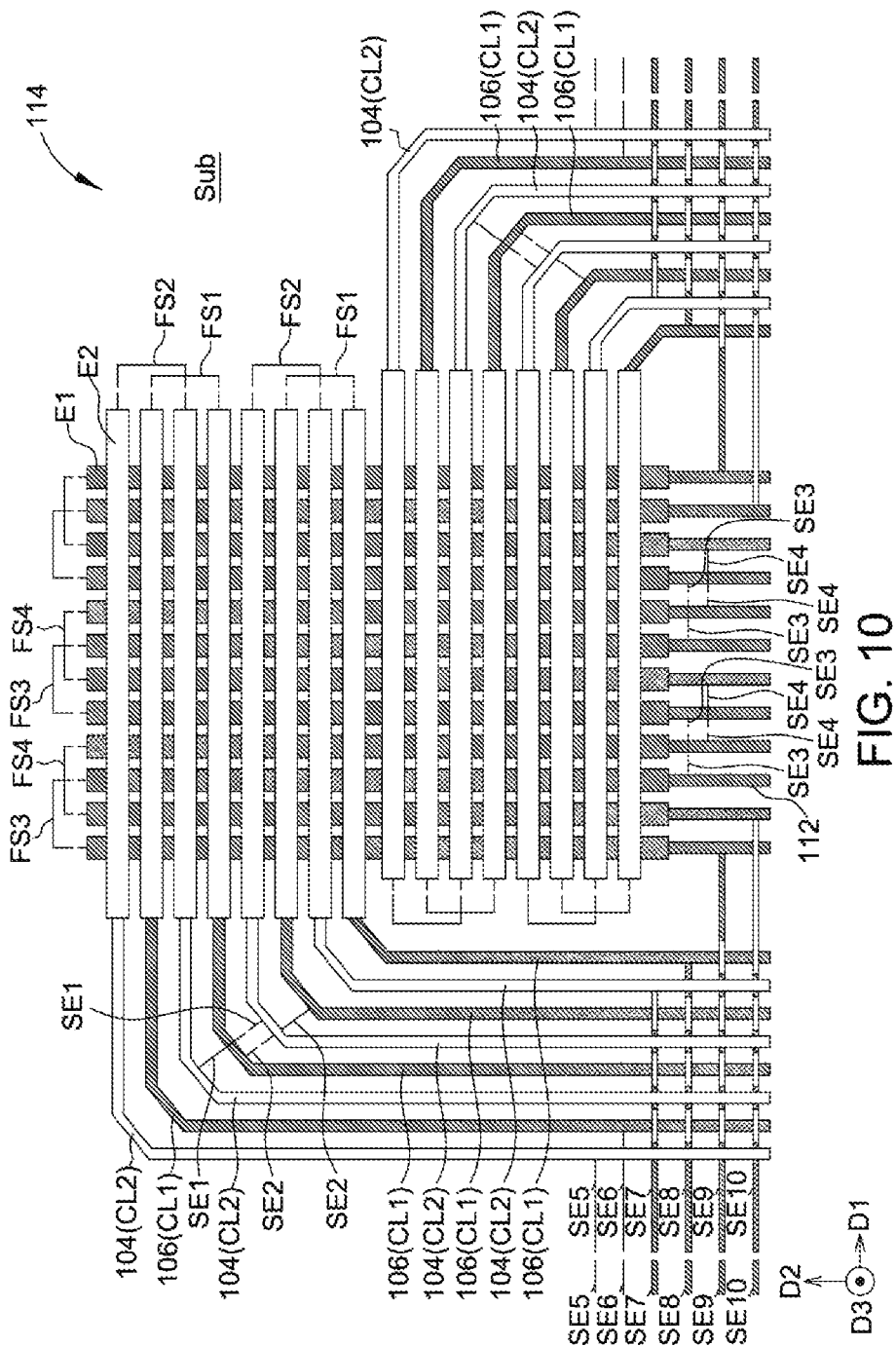
FIG. 10 is a top schematic diagram of a fingerprint sensor according to the first embodiment of the present invention.

FIG. 10 shows a top schematic diagram of a fingerprint sensor according to the first embodiment of the present invention. As shown in FIG. 10, after the inspection step is complete, if an open circuit exists in the first electrode strings ES1, the second electrode string ES2, the third electrode strings ES3 or the fourth electrode strings ES4, or a short circuit exists between the first electrode strings ES1 and the second electrode strings ES2, the inspection structure 100 is determined as a defective. If no open circuit exists in the first electrode strings ES1 and the second electrode strings ES2 and no short circuit exists between first electrode strings ES1 and the second electrode strings ES2, a laser cutting process is performed to electrically insulate the second electrode strips E2 to further form the fingerprint sensor 114 of the embodiment. More specifically, during the laser cutting process, each first connecting line segment CS1 is disconnected into a first floating line segment FS1, and each second connecting line segment CS2 is disconnected into a second floating line segment FS2. Further, when each first electrode string ES1 further includes the fifth connecting line segments CS5 and each second electrode string ES2 further includes the sixth connecting line segments CS6, in the laser cutting process, each fifth connecting line segment CS5 is disconnected into two first line segments SE1 and each sixth connecting line segment CS6 is disconnected into two second line segments SE2. As such, the second electrode strips E2 in each first electrode string ES1 and the second electrode strips E2 in each second electrode string ES2 may become mutually insulated. In this embodiment, the first floating line segments FS1 and the second floating line segments FS2 may be electrically insulated and separated from the second electrode strips E2. Each first line segment SE1 may electrically connect to one corresponding second electrode strip E2 in each third electrode set S3, i.e., to the non-outermost second electrode strip E2 in each third electrode set S3. Each second line segment SE2 may electrically connect to one corresponding second electrode strip E2 in each fourth electrode set S4, i.e., to the non-outermost second electrode strip E2 in each third electrode set S3. For example, in the laser cutting process, cutting is performed, for example but not limited to, along a cutting line CU shown in FIG. 5. Referring to FIG. 5, because the first connecting line segments CS1 and the second connecting line segments CS2 are directly disconnected by laser along the cutting line CU, two end points of each second floating line segment FS2 may respectively correspond to end points of two adjacent second electrode strips E2 in each third electrode set S3, and two end points of each first floating line segment FS1 may respectively correspond to end points of two adjacent second electrode strips E2 in each fourth electrode set S4. The width of the cutting line CU in the laser cutting process may be, for example, 8 μm, and so the distance by which each connecting line extends out from the end points of each electrode strip may be greater than the width of the laser cutting line CU.

Further, if no open circuit exists in the third electrode strings ES3 and the fourth electrode strings ES4 and no short circuit exists between the third electrode strings ES3 and the fourth electrode strings ES4, in the laser cutting process, the first electrode strips E2 are also electrically insulated. More specifically, in the laser cutting process, each third connecting line segment CS3 is disconnected into a third floating line segment FS3, and each fourth connecting line segment CS4 is disconnected into a fourth floating line segment FS4. Meanwhile, in the laser cutting process, each seventh connecting line segment CS7 is connected into two third line segments SE3, and each eighth connecting line segment CS8 is disconnected into two fourth line segments SE4. As such, the first electrode strips E1 in each third electrode string ES3 and the first electrode strips E1 in each fourth electrode strip ES4 may become mutually electrically insulated. In this embodiment, the third floating line segments FS3 and the fourth floating line segments FS4 may be electrically insulated and separated from the first electrode strips E1. Each third line segment SE3 may electrically connect to one corresponding first electrode strip E1 in each first electrode set S1, i.e., to the non-outermost first electrode strip E1 in each first electrode set S1. Each fourth line segment SE4 may electrically connect to one corresponding first electrode strip E1 in each second electrode set S2, i.e., to the non-outermost first electrode strip E1 in each second electrode set S2. Because the third connecting line segments CS3 and the fourth connecting line segments CS4 are directly disconnected by laser along the cutting line CU, two end points of each third floating line segment FS3 may respectively correspond to end points of two adjacent first electrode strips E1 in each first electrode set S1, and two end points of each fourth floating line segment FS4 may respectively correspond to end points of two adjacent first electrode strips E1 in each second electrode set S2.

Further, in the laser cutting process, the first bridging lines BL1, the second bridging lines BL2, the third bridging lines BL3, the fourth bridging lines BL4, the fifth bridging lines BL5, the sixth bridging lines BL6, the seventh bridging lines BL7 and eighth bridging lines BL8 may be selectively cut to electrically insulate the second electrode strips E2 from the second input signal ends SI2 and the second signal output ends SO2. More specifically, each first bridging line BL1 may be disconnected into two fifth line segments SE5, one of which is electrically connected to the corresponding first conductive line 104, i.e., to the first conductive line 104 electrically connected to the outermost second electrode strip E2 in the third electrode set S3. Each second bridging line BL2 may be disconnected into two sixth line segments SE6, one of which is electrically connected to the corresponding second conductive line 106, i.e., to the second conductive line 106 electrically connected to the outermost second electrode strip E2 in the fourth electrode set S4. The first cross connection portion of each third bridging line BL3 nearest to the inspection region IR may be disconnected into two seventh line segments SE7, one of which is electrically connected to the first conductive line 104, i.e., to the first conductive line 104 electrically connected to the second electrode strip E2 in the third electrode set S3 nearest to another second electrode group G2. The first cross connection portions 108 of each fourth bridging line BL4 nearest to the inspection region IR may be disconnected into two eighth line segments SE8, one of which is electrically connected to the corresponding second conductive line 106, i.e., to the second conductive line 106 electrically connected to the second electrode strip E2 in the fourth electrode set S4 nearest to another second electrode group G2. Similarly, the first cross connection portions 108 of each fifth bridging line BL5 and the first cross connection portion 108 of each eighth bridging line BL8 nearest to the inspection region IR may be disconnected into ninth line segments SE9, and the first cross connection portion 108 of each sixth bridging line BL6 and the first cross connection portion 108 of each seventh bridging line BL7 nearest to the inspection region IR may be disconnected into tenth line segments SE10.

The inspection step of the inspection structure 100 of this embodiment is before the step of providing a chip in the chip region CR, and therefore, the fingerprint sensor 114 manufactured according to this embodiment is capable of inspecting whether an issue of an open circuit or a short circuit exists before chips are attached onto the pads P1 and P2 of the chip region CR, hence preventing chip waste caused by defective fingerprint sensor 114 and further reducing production costs.

The fingerprinted sensor and the manufacturing method thereof of the present invention are not limited to the above embodiments. To better compare differences of the first embodiment over other embodiments or variation embodiments and to keep the description simple, the same components are represented by the same denotations in the other embodiments or variation embodiments below. Further, description is given in regard to the differences between the embodiments, and repeated details are omitted herein.

Figure 11:
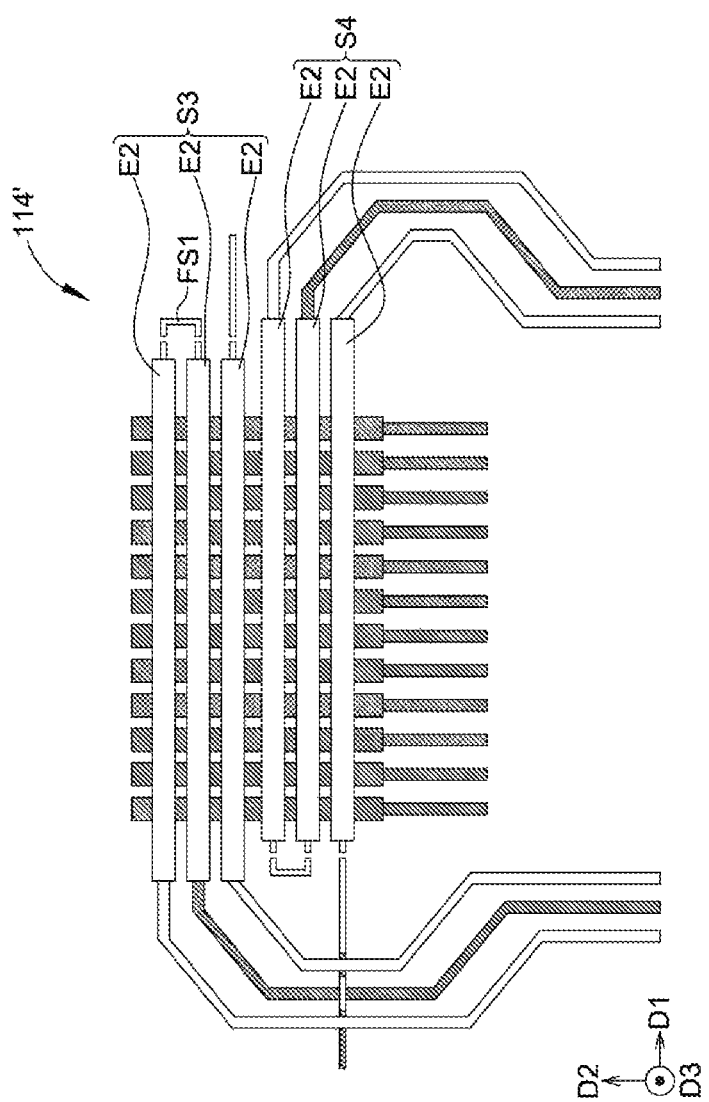
FIG. 11 is a top schematic diagram of a fingerprint sensor according to another variation embodiment according to the first embodiment of the present invention.

FIG. 11 shows a top schematic diagram of a fingerprint sensor according to another variation embodiment of the first embodiment of the present invention. As shown in FIG. 11, compared to the first embodiment above, a fingerprint sensor 114' of this variation embodiment differs from the first embodiment above in that, the third electrode sets S3 and the fourth electrode sets S4 in each second electrode group G2 are sequentially arranged along the second direction D2. In other words, the third electrode set S3 comprises continuously arranged second electrode strips E2, and the fourth electrode set S4 also comprises continuously arranged second electrode strips E2. Thus, no second electrode strip E2 of the fourth electrode set S4 is disposed between any two adjacent second electrode strips E2 in the third electrode set S3, and no second electrode strip E2 of the third electrode set S3 is disposed between any two adjacent second electrode strips E2 in the fourth electrode set S4.

Figure 12:
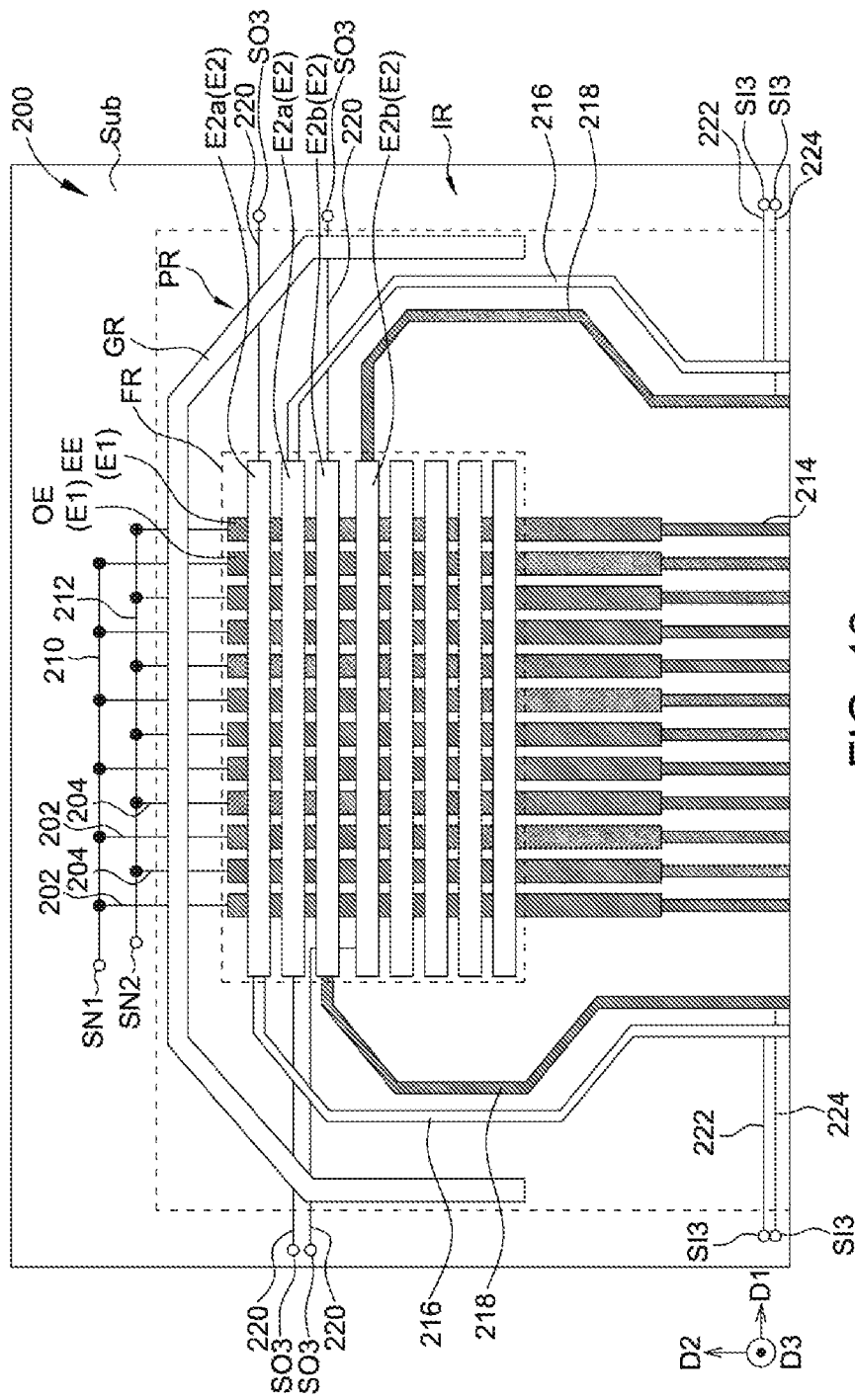
FIGS. 12 and 13 are schematic diagrams of a manufacturing method of a fingerprint sensor according to a second embodiment of the present invention.
Figure 13:
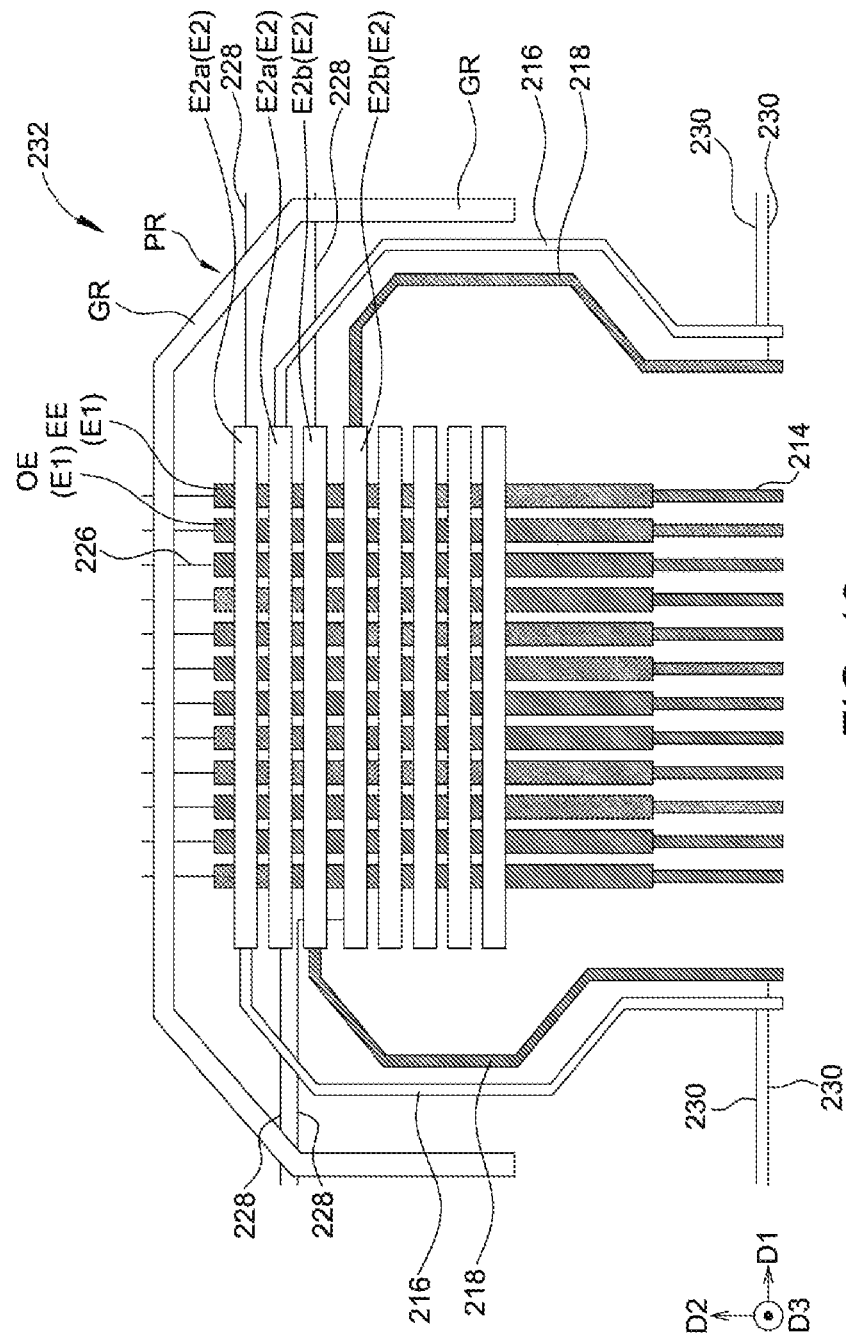

Referring to FIGS. 12 and 13, FIG. 12 shows a schematic diagram of a manufacturing method for a fingerprint sensor according to a second embodiment of the present invention; FIG. 13 shows a top schematic diagram of a fingerprint sensor according to the second embodiment of the present invention. As shown in FIG. 12, a substrate Sub and an inspection structure 200 are first provided. In this embodiment, the inspection structure 200 includes a plurality of first electrode strips E2, a plurality of odd-number inspection line segments 202, a plurality of even-number inspection line segments 204 and a plurality of second electrode strips E2 provided on the substrate Sub. The first electrode strips E1 may include a plurality of odd-number electrode strips OE and a plurality of even-number electrode strips EE, and the odd-number electrode strips OE and the even-number electrode strips EE may be sequentially and alternatingly arranged in the fingerprint sensing region FR. The second electrode strips E2 may be arranged along the second direction D2 in the fingerprint sensing region FR, and are insulated from and intersect the first electrode strips E1. The first electrode strips E1 may be formed by a first conductive layer CL1, the second electrode strips E2 may be formed by a second conductive layer CL2, and a first insulation layer IN1 may be provided between the first conductive layer CL1 and the second conductive layer CS2, wherein the first insulation layer IN1 is for electrically insulating the first electrode strips E1 from the second electrode strips E2, such that coupling capacitance is formed by the first electrode strips E1 and the second electrode strips E2, so as to detect capacitance differences between ridges and valleys of fingerprints and achieve the object of fingerprint sensing. The configuration of the first conductive layer CL1, the second conductive layer CL2 and the first insulation layer IN1 may be identical to that of the first embodiment as shown in FIG. 6, and repeated details are omitted herein. Further, each odd-number inspection line segment 202 may electrically connect to one corresponding odd-number electrode strip OE, and the odd-number inspection line segments 202 are electrically connected to one same first signal input end SN1. Each even-number inspection line segment 204 may electrically connect to one corresponding even-number electrode strip EE, and the even-number inspection line segments 204 are electrically connected to one same second signal input end SN2. Thus, the odd-number inspection line segments 202 and the even-number line-segments 204 may be sequentially and alternating arranged along the first direction D1.

The inspection structure 200 may further include a guard ring GR. The guard ring GR is provided at outer sides of the first electrode strips E1 and the second electrode strips E2 and insulated from the first electrode strips E1 and the second electrode strips E2, and serves a function of electrostatic protection. To electrically connect the odd-number inspection line segments 202 to the same first signal input end SN1 and to electrically connect the even-number inspection line segments 204 to the same second signal input end SN2, the odd-number inspection line segments 202 and the even-number inspection line segments 204 extend from the fingerprint sensing region FR via the peripheral regions PR to the inspection region IR, and thus cross the guard ring GR and overlap the guard ring GR in a top view direction D3 of the substrate Sub. In this embodiment, the guard ring GR and the second electrode strips E2 may be formed by the same second conductive layer CL2, and the odd-number inspection line segments 202, the even-number inspection line segments 204 and the first electrode strips E1 may be formed by the same first conductive layer CL1, such that the odd-number inspection line segments 202 and the even-number inspection line segments 204 may be electrically insulated from the guard ring GR by means of the first insulation layer IN1. However, the present invention is not limited to the above example. In another embodiment, the odd-number inspection line segments 202, the even-number inspection line segments 204 and the guard ring GR may be formed by different conductive layers.

In this embodiment, the inspection structure 200 may further include a first inspection line 210 and a second inspection line 212 provided on the substrate Sub in the inspection region IR. The first inspection line 210 electrically connect the odd-number inspection line segments 202 to the first signal input end SN1, and the second inspection line 212 electrically connect the even-number inspection line segments 204 to the second signal input end SN2. The second inspection line 212 is provided between the first inspection line 210 and the guard ring GR, and thus, for example but not limited to, crosses the odd-number inspection line segments 202 in order to electrically connect the even-number inspection line segments 204 to the second input end SN2. In another embodiment, the first inspection line 210 may also be provided between the second inspection line 212 and the guard ring GR, and thus the first inspection line 210 crosses the even-number inspection line segments 204. In this embodiment, the second inspection line 212 and the odd-number inspection line segments 202 may be formed by different conductive layers so as to electrically insulate the second inspection line 212 from the odd-number inspection line segments 202. For example, the odd-number inspection line segments 202 may be formed by the first conductive layer CL1, and the second inspection line 212 may be formed by the second conductive layer CL2. The first inspection line 210 may be formed by the first conductive layer CL1 or the second conductive layer CL2.

In this embodiment, the inspection structure 200 further includes a plurality of third conductive lines 214, which respectively correspond to the first electrode strips E1 and electrically connect the first electrode strips E1 to the pads. For example, the third conductive lines 214 may be formed by the first conductive layer CL1.

The inspection structure 200 may further include a plurality of first conductive lines 216 and a plurality of second conductive lines 218. The second electrode strips E2 may include a plurality of first sub-electrode strips E2a and a plurality of second sub-electrode strips E2b. Each first sub-electrode strip E2a may electrically connect to one corresponding first conductive line 216, and each second sub-electrode strip E2 may electrically connect to the corresponding second conductive line 218. In this embodiment, every two first sub-electrode strips E2a and every two second sub-electrode strips E2b are sequentially and alternatingly arranged along the second direction D2. Further, the two first conductive lines 216 respectively electrically connected to two adjacent first sub-electrode strips E2a are respectively provided on two sides of the first sub-electrode strips E2a, and two second conductive lines 218 respectively electrically connected to two adjacent second sub-electrode strips E2b are respectively provided on two sides of the second sub-electrode strips E2b. With the above configuration, the first conductive lines 216 and the second conductive lines 218 located on any side of the second electrode strips E2 may be sequentially and alternatingly arranged. By forming the first conductive lines 216 by the second conductive layer CL2 and forming the second conductive lines 218 by the first conductive layer CL1, the distance between adjacent first conductive line 216 and second conductive line 218 is not limited by the patterning process and can be reduced, so as to further reduce the width of the peripheral regions PR on the left and right sides of the fingerprint sensing region FR.

The inspection structure 200 may further include four first inspection line segments 220. Each first inspection line segment 220 is connected to the two outermost first sub-electrode strips E2a and two outermost second sub-electrode strips E2b, and extends from the fingerprint sensing region FR through the peripheral regions PR to the inspection region IR. Thus, each first inspection line segment 220 crosses the guard ring GR and overlaps the guard ring GR in a top view direction D3 of the substrate Sub. To be insulated from the guard ring GR, the first inspection line segments 220 may be formed, e.g., the first conductive layer CL1. Each first inspection line segment 220 may electrically connect the corresponding first sub-electrode strips E2a or the corresponding second sub-electrode strips E2b to one corresponding third signal output end SO3. The outermost first sub-electrode strip E2a is provided between the corresponding first inspection line segment 220 and the corresponding first conductive line 216, and the outermost second sub-electrode strip E2b is provided between the corresponding first inspection line segment 220 and the corresponding second conductive line 218. Because two first conductive lines 216 respectively electrically connected to two adjacent first sub-electrode strips E2a are respectively provided on two sides of the first sub-electrode strips E2a, the first inspection line segments 220 connected to two adjacent first sub-electrode strips E2a are also provided on two sides of the first sub-electrode strips E2a. Similarly, two first inspection line segments 220 respectively electrically connected to two adjacent second sub-electrode strips E2b are also respectively provided on two sides of two sub-electrode strips E2b.

The inspection structure 200 further includes two second inspection line segments 222 and two third inspection line segments 224. The two inspection line segments 222 are respectively connected to two first conductive lines 216 corresponding to two outermost first sub-electrode strips E2a, and extend from the peripheral regions PR to the inspection region IR so as to electrically connect the corresponding first sub-electrode strips E2a to one corresponding third signal input end S13. The third inspection line segments 224 are respectively connected to two conductive lines 218 corresponding to two outermost second sub-electrode strips E2b, and extend from the peripheral regions PR to the inspection region IR so as to electrically connect the corresponding second sub-electrode strips E2b to one corresponding third signal input end S13. For example, the second inspection line segments 222 may be formed by the second conductive layer CL2, and the third inspection line segments 224 may be formed by the first conductive layer CL1, and so the third inspection line segments 224 may cross the outermost first conductive lines 216 without electrically connecting to the first conductive lines 216.

After the inspection structure 200 is complete, an inspection step is performed. In the inspection step, a first voltage signal is provided at the first signal end SN1, and a second voltage signal is measured at the second signal end SN2 to determine whether a short circuit occurs between the odd-number electrode strips OE and the even-number electrode strips EE. In this embodiment, in the inspection step, a third voltage signal is further provided at each second inspection line segments 222 and each third inspection line segments 224, and a corresponding fourth voltage signal is measured at each first inspection line segment 220 to determine whether an open circuit occurs in the first sub-electrode strips E2a and the second sub-electrode strips E2b or whether a short circuit occurs between the first sub-electrode strips E2a and the second sub-electrode strips E2b.

As shown in FIG. 13, after the inspection step is complete, if a short circuit occurs between the odd-number electrode strips OE and the even-number electrode strips EE, an open circuit occurs in the first sub-electrode strips E2a and the second sub-electrode strips E2b, or a short circuit occurs between the first sub-electrode strips E2a and the second sub-electrode strips E2b, the inspection structure 200 is determined as a defective. If none of the above situation occurs, a cutting process is performed. In the cutting process, the odd-number inspection line segments 202 and the even-number line segments 204 are disconnected to electrically insulate the odd-number electrode strips OE from the even-number electrode strips EE to form a plurality of first line segments 226. The first line segments 226 may include a plurality of odd-number line segments and a plurality of even-number line segments, the odd-number line segments are connected to the odd-number electrode strips OE, and the even-line segments are connected to the even-number electrode strips EE. Thus, a fingerprint sensor 232 of this embodiment is formed. For example, the cutting process may be a process that cuts and separates the substrate Sub of the inspection region IR from the substrate Sub of the device region DR or a laser cutting process. In this embodiment, each first line segments 226 is electrically connected to one corresponding first electrode strip E1, and the first line segments 226 overlap the guard ring GR in the top view direction D3 of the substrate Sub.

Further, in the cutting process, the first inspection line segments 220, the second inspection line segments 222 and the third inspection line segments 224 are disconnected to form four second line segments 228 and four third line segments 230. Each second line segment 228 is connected to two outermost first sub-electrode strips E2a and two outermost second sub-electrode strips E2b, and the third line segments 230 are connected to the first conductive lines 216 and the second conductive lines 218 electrically connected to the second line segments 228. The outermost first sub-electrode strip E2a is provided between the corresponding second line segment 228 and the corresponding first conductive line 216, and the outermost second sub-electrode strip E2b is provided between the corresponding second line segment 228 and the corresponding second conductive line 218. Further, the second line segments 228 overlap the guard ring GR in the top view direction D3 of the substrate Sub.

Figure 14:
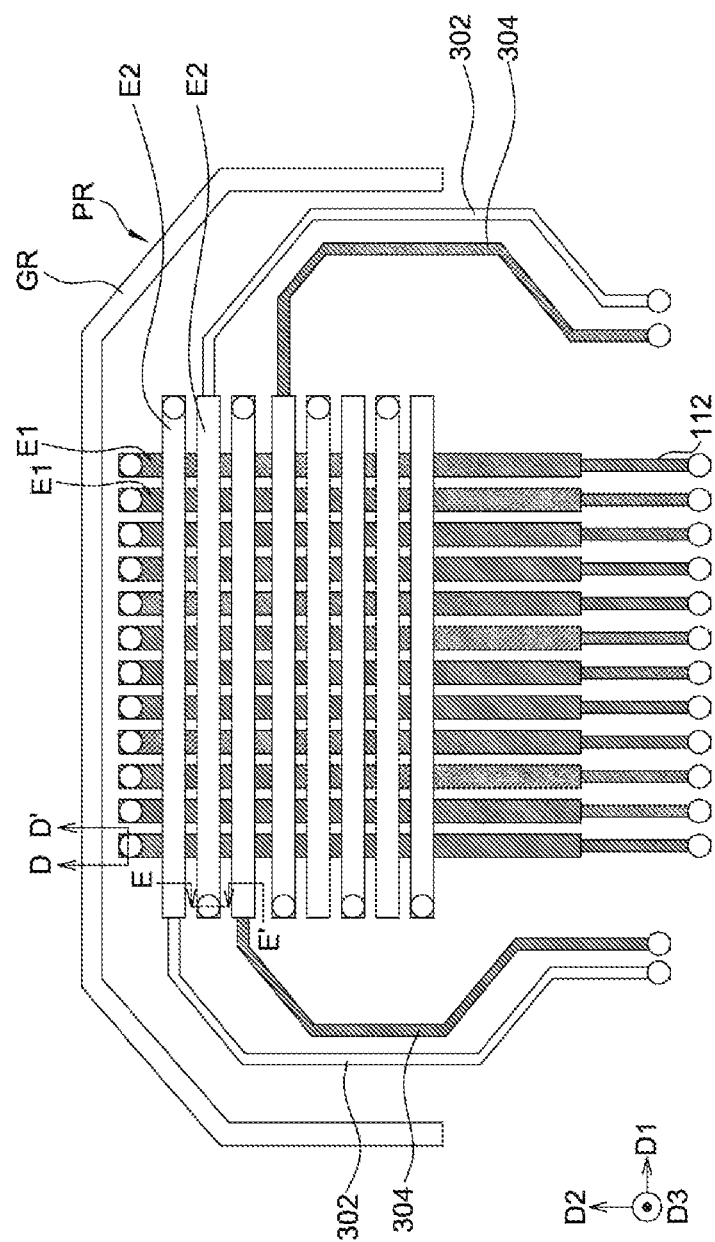
FIG. 14 is a top schematic diagram of a fingerprint sensor according to a third embodiment of the present invention.
Figure 15:
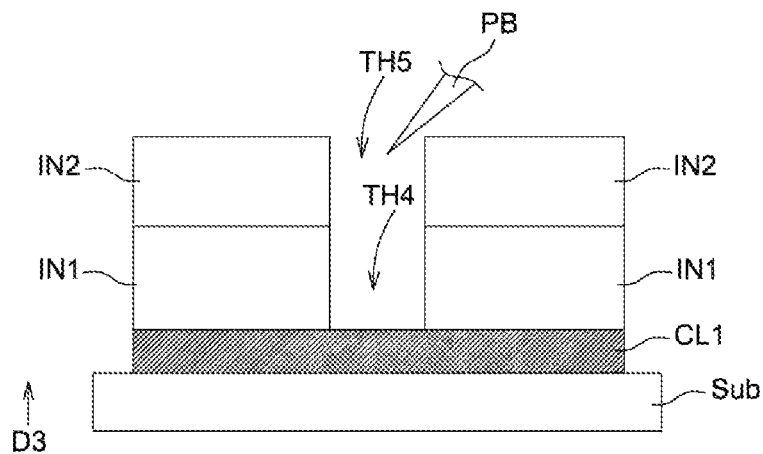
FIGS. 15 and 16 are sectional schematic diagrams along section lines D-D' and E-E' in FIG. 14, respectively.
Figure 16:
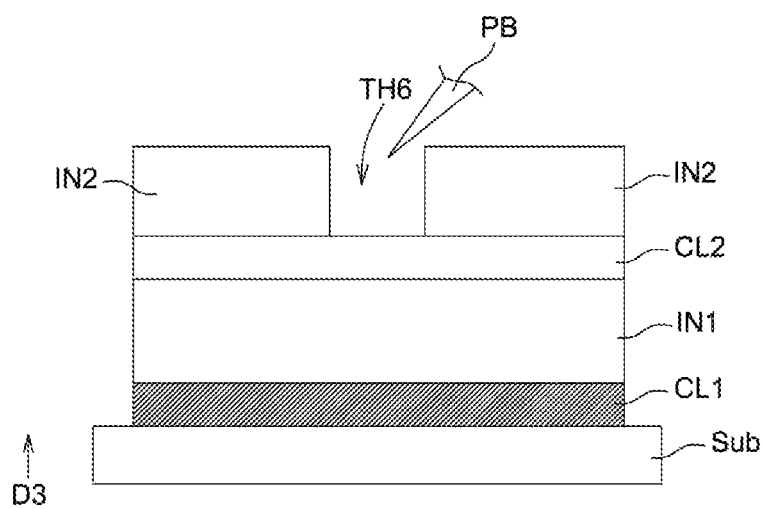

Referring to FIGS. 14 to 16, FIG. 14 shows a top schematic diagram of a fingerprint sensor according to a third embodiment of the present invention; FIGS. 15 and 16 are sectional schematic diagrams along section lines D-D' and E-E' in FIG. 14. As shown in FIGS. 14 to 16, a fingerprint sensor 300 of this embodiment differs from the inspection structures of the above embodiments in that, two ends of each first electrode strip E1 and one end of each second electrode strip E2 as well as the corresponding first conductive line 302 or second conductive line 304 are respectively exposed by vias, so as to directly utilize a probe PB to inspect whether an open circuit exists in the first electrode strips E1 and the second electrode strips E2, and whether a short circuit exists between the first electrode strips E1 and the second electrode strips E2. More specifically, as shown in FIG. 15, the first insulation layer IN1 and the second insulation layer IN2 may respectively include vias TH4 and TH5, and the via TH4 of the second insulation layer IN2 corresponds to the via TH5 of the first insulation layer IN1, so as to accordingly expose one end of each first electrode strip E1 formed by the first conductive layer CL1. Similarly, the first insulation layer IN1 and the second insulation layer IN2 corresponding to the other end of each first electrode strip E1 and the second conductive lines 304 may have the same structure. One end of each second conductive line 304 away from the second electrode strip E2 is exposed.

As shown in FIG. 16, the second insulation layer IN2 located on the second conductive layer CL2 may have another via TH6, which exposes the second electrode strip E2 formed by the second conductive layer CL2. More specifically, one end of each second electrode strip E2 away from the end connected to the corresponding first conductive line 302 or second conductive line 304 is exposed by the via TH6. Similarly, the second insulation layer IN2 corresponding to the first conductive lines 302 may have the same structure. One end of each first conductive line 302 away from the second electrode strip E2 is exposed.

By forming the vias TH4, TH5 and TH6 at two ends of the first electrode strips E1 and at two ends of the second electrode strips E2, a wafer-scale probe PB may be directly utilized to inspect whether an open circuit exists in the first electrode strips E1 and the second electrode strips E2 and whether a short circuit exist between the first electrode strips E1 and the second electrode strips E2. Thus, the fingerprint sensor 300 of this embodiment does not require an additional laser cutting process after the inspection step. Because the distance between centers of adjacent first electrode strips E1 is only 50μ, such inspection method can be performed only in wafer foundries having wafer-scale inspection apparatuses.

In another embodiment, the structure of the fingerprint sensor of any of the above embodiments and the manufacturing method are applicable to touch panels, such embodiment differs from the above embodiments in that, the distance between centers of any two adjacent first electrode strips E1 and the distance between centers of any two adjacent second electrode strips E2 of the touch panel are greater than the distance between centers of any two adjacent first electrode strips E1 and the distance between centers of any two adjacent second electrode strips E2 of the fingerprint sensor.

In conclusion, as the inspection step of the inspection structure of the sensor is before the step of providing chips in the chip region, the fingerprint sensor manufactured by the present invention is capable of inspecting whether an issue of an open circuit or a short circuit exist before attaching chips onto pads in the chip region, thereby preventing chip wasted caused by defective sensors and further reducing production costs.

While the invention has been described by way of example in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sensor, comprising:
   a substrate;
   at least one first electrode group, disposed on the substrate, the at least one first electrode group comprising a first electrode set and a second electrode set, each of the first electrode set and the second electrode set comprising a plurality of first electrode strips;
   a plurality of floating line segments, formed by a same first conductive layer as the at least one first electrode group, the first floating line segments insulated and separated from the at least one first electrode group;
   an insulation layer, disposed on the first conductive layer;
   a plurality of second electrode groups, disposed on the insulation layer, the second electrode group sequentially arranged along a second direction and intersecting the at least one first electrode group, each of the second electrode groups comprising a third electrode set and a fourth electrode set, each of the third electrode set and the fourth electrode set comprising a plurality of second electrode strips; and
   a plurality of second floating line segments, formed by a second conductive layer as the second electrode groups, the second floating line segments insulated and separated from the second electrode groups, wherein two end points of each of the second line segments respectively correspond to end points of two adjacent of the second electrode strips in each of the third electrode sets, and two end points of each of the floating line segments respectively correspond to end points of two adjacent of the second electrode strips in each of the fourth electrode sets.

2. The sensor according to claim 1, being a fingerprint sensor.

3. The sensor according to claim 1, being a touch panel.

4. The sensor according to claim 1, further comprising a plurality of first conductive lines and a plurality of second conductive lines, wherein the first conductive lines are formed by the second conductive layer and the second conductive lines are formed by the first conductive layer, each of the first conductive lines is electrically connected to one corresponding second electrode strip in each of the third electrode sets, and each of the second conductive lines is electrically connected to one corresponding second electrode strip in each of the fourth electrode sets.

5. The sensor according to claim 1, wherein the second electrode strips of the third electrode set and the second electrode strips of the fourth electrode set in each of the second electrode groups are sequentially and alternatingly arranged along the second direction.

6. The sensor according to claim 1, wherein the third electrode sets and the fourth electrode sets in the second electrode groups are sequentially arranged along the second direction.

7. The sensor according to claim 1, wherein the first electrode strips of the first electrode set and the first electrode strips of the second electrode set are sequentially and alternatingly arranged along a first direction.

8. The sensor according to claim 1, further comprising a plurality of first line segments and a plurality of second line segments, wherein the first line segments are formed by the first conductive layer, the second line segments are formed by the second conductive layer, each of the first line segments is electrically connected to one corresponding second electrode strip in each of the third electrode set, and each of the second line segments is electrically connected to one corresponding second electrode strip in each of the fourth electrode sets.

9. The sensor according to claim 1, further comprising a plurality of floating line segments and a plurality of fourth line segments, wherein the third floating line segments are formed by the first conductive layer, the fourth line segments are formed by the second conductive layer, two end points of each of the third floating line segment respectively correspond to end points of two adjacent of the first electrode strips in the first electrode set, and two end points of each of the fourth floating line segments respectively correspond to end points of two adjacent of the first electrode strips in each of the second electrode sets.

10. The sensor according to claim 1, further comprising a plurality of third line segments and a plurality of fourth line segments, wherein the third line segments are formed by the first conductive layer, the fourth line segments are formed by the second conductive layer, each of the third line segments is electrically connected to one corresponding first electrode strip in the first electrode set, and each of the fourth line segments is electrically connected to one corresponding first electrode strip in the second electrode set.

11. The sensor according to claim 1, wherein when the sensor performs inspection, each of the first floating line segments is electrically connected to two adjacent of the second electrode strips in each of the fourth electrode sets, and each of the second floating line segments is electrically to two adjacent of the second electrode strips in each of the third electrode sets.

12. A manufacturing method of a sensor, comprising:
providing an inspection structure, comprising:
   at least one first electrode group, comprising a first electrode set and a second electrode set, wherein each of the first electrode set and the second electrode set comprises a plurality of first electrode strips;
   a plurality of first connecting line segments, formed by a same first conductive layer as the at least one first electrode group, the first connecting line segments insulated and separated from the at least one first electrode group;
   an insulation layer, disposed on the first conductive layer;
   a plurality of second electrode groups, disposed on the insulation layer, the second electrode groups sequentially arranged along a second direction and insulated from and intersecting the at least one first electrode group, wherein each of the second electrode group comprises a third electrode set and a fourth electrode set, and each of the third electrode set and the fourth electrode set comprises a plurality of second electrode strips; and
   a plurality of second connecting line segments, formed by a same second conductive layer as the second electrode groups, wherein the second electrode strips of the third electrode set in each of the second electrode groups are electrically connected in series by at least one of the second connecting line segments to form a first electrode string, and the second electrode strips of the fourth electrode set in each of the second electrode groups are electrically connected in series by at least one of the first connecting line segments to form a second electrode string; and
performing an inspection step, comprising providing a first voltage signal at one end of each of the first electrode strings and at one end of each of the second electrode strings, and measuring a second voltage signal at one other end of each of the first electrode strings and one other end of each of the second electrode strings, so as to determine whether an open circuit exists in the first electrode strings and the second electrode strings or whether a short circuit exists between each of the first electrode strings and the corresponding second electrode string.

13. The manufacturing method of a sensor according to claim 12, wherein the sensor is a fingerprint sensor.

14. The manufacturing method of a sensor according to claim 12, wherein the sensor is a touch panel.

15. The manufacturing method of a sensor according to claim 12, further comprising, when no open circuit exists in the first electrode strings and the second electrode strings and no open circuit exists between the first electrode strings and the second electrode strings, electrically insulating the second electrode strips.

16. The manufacturing method of a sensor according to claim 12, wherein the inspection structure further comprises a plurality of third connecting line segments and a plurality of fourth connecting line segments, the third connecting line segments are formed by the first conductive layer, the fourth connecting line segments are formed by the second conductive layer, the first electrodes of the first electrode set in the at least one first electrode group are connected in series by the third connecting line segments to electrically connect into a third electrode string, and the first electrode strips in the second electrode set in the at least one first electrode group are connected in series by the fourth connecting line segments to electrically connect into a fourth electrode string; the inspection step further comprises providing a third voltage signal to one end of each of the third electrode strings and one end of each of the fourth electrode strings, and measuring a fourth voltage signal at one other end of each of the third electrode strings and at one other end of each of the fourth electrode strings.

17. The manufacturing method of a sensor according to claim 12, further comprising performing a laser cutting process to electrically insulate the first electrode strips when no open circuit exists in the third electrode strings and the fourth electrode strings and no short circuit exists between the third electrode strings and the fourth electrode strings.

* * * * *